United States Patent [19]

Ruhl

[11] Patent Number: 5,161,297
[45] Date of Patent: Nov. 10, 1992

[54] GOLD INK COATING OF THERMOCOUPLE SHEATHS

[75] Inventor: H. Kenneth Ruhl, Schenectady, N.Y.

[73] Assignee: The United States of America as represented by the United States Department of Energy, Washington, D.C.

[21] Appl. No.: 663,519

[22] Filed: Mar. 4, 1991

[51] Int. Cl.⁵ .................. B23P 13/04; C25F 3/24; B05D 1/36; B05D 3/04
[52] U.S. Cl. .................... 29/557; 204/129.1; 204/129.9; 204/129.95; 427/264; 427/304; 427/437
[58] Field of Search .......... 204/129.1, 129.35, 129.95, 204/129.9, 32.1, 37.1; 427/304, 331, 264, 437; 29/557

[56] References Cited

U.S. PATENT DOCUMENTS

| | | | |
|---|---|---|---|
| 3,775,279 | 11/1973 | Boley | 204/141.5 X |
| 4,270,986 | 6/1981 | Smith | 204/129.1 X |
| 4,279,951 | 7/1981 | Hough et al. | 427/304 X |

Primary Examiner—Donald R. Valentine
Attorney, Agent, or Firm—Virginia B. Caress; William R. Moser; Richard E. Constant

[57] ABSTRACT

A method is provided for applying a gold ink coating to a thermocouple sheath which includes the steps of electropolishing and oxidizing the surface of the thermocouple sheath, then dipping the sheath into liquid gold ink, and finally heat curing the coating. The gold coating applied in this manner is highly reflective and does not degrade when used for an extended period of time in an environment having a temperature over 1000° F. Depending on the application, a portion of the gold coating covering the tip of the thermocouple sheath is removed by abrasion.

11 Claims, 1 Drawing Sheet

GOLD INK COATING OF THERMOCOUPLE SHEATHS

FIELD OF THE INVENTION

The invention relates to a method for applying a gold ink coating to the surface of a thermocouple sheath.

BACKGROUND OF THE INVENTION

Stainless steel sheathed thermocouples are commonly used to measure the temperature of a material in environment of high thermal radiation. It is known that measurement errors inherent in such thermocouple devices can be reduced by coating the sheath of the thermocouple with gold ink which has a very low thermal emissivity. To this end, various methods have been developed for coating a thermocouple sheath with gold ink.

Briefly summarizing the steps of an exemplary prior art coating method, the thermocouple sheath is hand-painted with gold ink, then heated and cured at over a 1000° F. for one hour, and finally hand polished. The steps of hand-painting, curing and hand-polishing are typically repeated at least once.

This prior art method suffers a number of disadvantages and has been found to be generally unsatisfactory. For example, hand-painting and hand-polishing of the thermocouple sheath is time-consuming and costly. More importantly however, hand-polishing is inadequate to effectively prepare the surface of the thermocouple sheath for subsequent application of gold ink. As a result, a gold ink coating thus applied is not sufficiently smooth and shiny, and, since reflectivity is important for minimizing thermocouple measurement errors, the performance of the associated thermocouple is thereby limited. Further, as a result of ineffective hand-polishing, the gold ink coating deteriorates quickly when exposed to temperatures above 1000° F. and becomes blackened and ineffective after only a few hours of use.

SUMMARY OF THE INVENTION

In accordance with the invention, a method is provided for gold coating a metal surface which overcomes the disadvantages of the prior art discussed above. The method of the invention comprises the steps of: i) electropolishing the surface to remove an outer layer of the surface, ii) oxidizing the surface by placing the surface in an air environment at over 1000° F., iii) dipping the surface into liquid gold ink to thereby provide a gold coating on the surface, and iv) curing the gold coating by placing the surface in an oven environment at over 1000° F.

A thermocouple sheath coated according to the method of the invention is more reflective than a sheath coated by a prior art method. Further a thermocouple sheath coating according to this method can withstand extended use within an environment having a temperature of 1000° F. or more.

Other features and advantages of the invention will be set forth in, or be apparent from, the detailed description of the preferred embodiments which follows.

DETAILED DESCRIPTION OF THE PREFERRED EMBODIMENT

Figure 2:
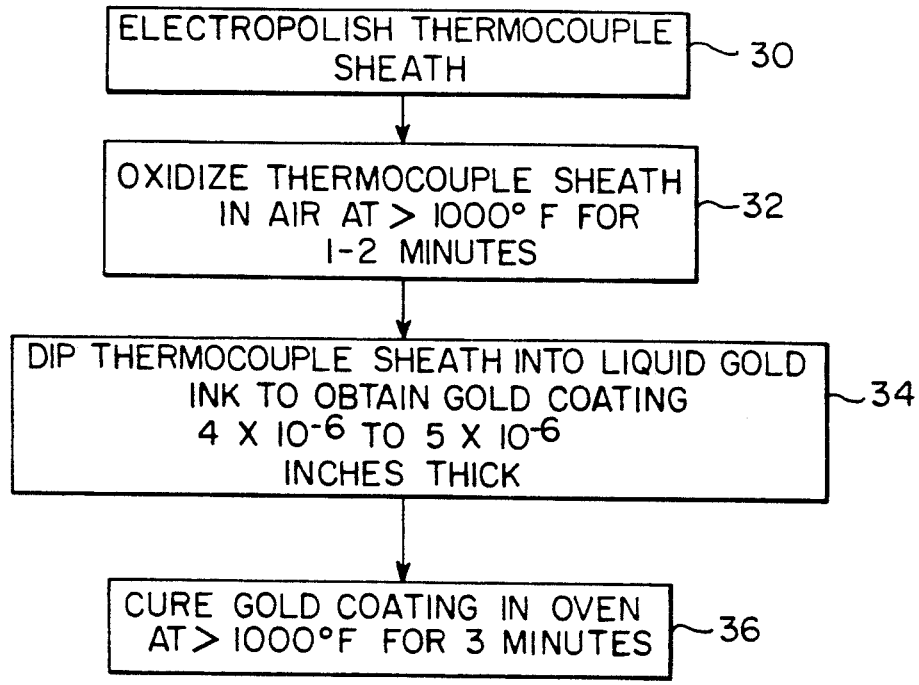
FIG. 2 is a block diagram summarizing the basic steps of the method of the invention.

Referring to the drawings, a preferred embodiment of the invention will now be described. As discussed above, the invention involves a method for applying a gold coating to a surface, such as the surface of a thermocouple, so that the surface can withstand prolonged temperatures of 1200° F. without blackening or otherwise degrading. Although the method can be applied to various other metal surfaces, the discussions below refer only to a thermocouple sheath surface, as illustrated.

Figure 1:
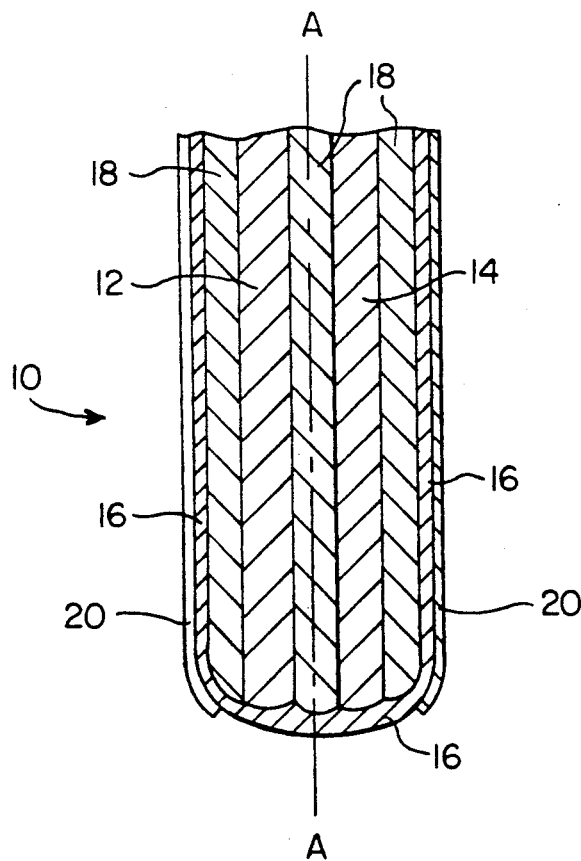
FIG. 1 is a transverse corss-sectional view of a thermocouple coated in accordance with the method of the invention.

FIG. 1 shows a thermocouple 10 which includes parallel metal lead wires 12 and 14 integrally welded to the inside surface of a stainless steel sheath 16. Sheath 16 includes a hemispherical end in the vicinity of the junction with lead wires 12 and 14. Sheath 16 is generally cylindrical along the remaining length of wires 12 and 14. A ceramic insulator 18 is provided between lead wires 12 and 14 and sheath 16 as shown. Thermocouple 10 is of conventional design and is only shown to facilitate the description of the method of the invention provided below.

A gold coating 20 is applied, by the method of the invention, to the exterior surface of sheath 16 both over the hemispherical and cylindrical portions thereof. However, the portion of gold coating 20 covering the hemispherical surface of sheath 16 is removed, yielding the structure as shown.

Briefly summarizing the method, as shown in FIG. 2, for applying gold coating 20 to thermocouple sheath 16, the method comprises the following steps: first, an electropolishing step 30 is performed to clean and polish the sheath 16; second, an oxidizing step 32 is performed to create a thin adherent film (not shown in FIG. 1) on sheath 16; thirdly, a dipping step 34 is performed wherein sheath 16 is dipped in gold ink to provide gold coating 20; and fourthly, a curing step 36 is performed to cure gold coating 20. Dipping step 34 and curing step 36 are repeated a number of times to provide a gold coating 20 with suitable thickness. Finally, the porton of gold coating 20 covering the hemispherical portion of thermocouple sheath 16 is removed to expose a portion of the sheath.

Now considering the method steps shown in FIG. 2 in greater detail, electropolishing step 30 is performed in a conventional manner wherein sheath 16 is immersed in an electrolyte bath which removes a thin layer from the surface of steel sheath 16. Preferably, electropolishing proceeds until a layer of steel is removed from sheath 16 to a depth of about 0.0005 inches to 0.001 inches. Care should be taken to avoid excessive metal loss at the interface between the electrolyte bath and the air.

Although any conventional electropolishing process will suffice, the following exemplary, non-limiting process has been found to be satisfactory. The electrolyte used for electropolishing consists of a mixture of two parts by volume of phosphoric acid $H_3PO_4$ (85.2%) and one part by volume of sulfuric acid $H_2SO_4$ (95-98%) mixed together in a one gallon glass beaker. The temperature of this mixture is maintained between 68° F. and 72° F. A stainless steel electrode is mounted in the electrolyte bath with the surface area of the electrode being about 20 square inches. The electrode is connected to the cathode a 12 volt DC battery charger rated at 20 amps while sheath 16 is connected to the anode of the 12 volt battery charger.

Table I provides the results of sample electropolishing steps wherein ⅛ inch diameter 304 stainless steel rods were immersed one inch into the above-described electrolyte. The duration of electropolishing and the resulting amount of metal removal is shown in Table I.

TABLE I

| Time in Seconds | Approximate Inches per Surface |
| --- | --- |
| 15 | .0005 |
| 30 | .0010 |
| 60 | .0015 |
| 120 | .0030 |

After electropolishing, sheath 16 is completely cleaned with de-ionized water to remove electrolytes. Further, it is important that sheath 16 is completely protected from contamination by e.g. finger prints, dust, etc., prior to subsequent steps.

During oxidation step 32, sheath 16 is placed in a furnace having a temperature of 1150° F. for a period of 1 to 2 minutes. As a result of oxidation, sheath 16 acquires a thin and tightly adherent straw colored film (not shown in FIG. 1). The straw colored film provides a base for the subsequent application of gold coating 20. After oxidation, sheath 16 is cooled to room temperature. Again care is taken to maintain complete cleanliness of sheath 16.

During dipping step 34, sheath 16 is dipped by conventional means into a vat of liquid gold ink. A suitable gold ink is "HANOVIA LIQUID GOLD INK No. 7621" supplied by Engelhard Industries Division, 1 West Central Avenue, East Newark, N.J., 07029. The gold ink has the appearance of thick cranberry juice and, after dipping, leaves a cranberry colored coating on sheath 16.

To assure a uniform coating over the surface, the sheath 16 is dipped into the gold ink with the axis of sheath 16, indicated by line A—A of FIG. 1, maintained vertically. Lowering and lifting of sheath 16 into the gold ink bath should be performed slowly, i.e. at a rate of approximately 0.25 inches per second, such that surface tension at the surface of the gold ink helps to provide a uniform coating of gold ink. Also, the liquid gold ink should be thoroughly mixed prior to dipping and the viscosity of the liquid gold ink should be maintained constant during the entire dipping step. To attain suitable viscosity, a conventional thinner can be added to the liquid gold ink.

During curing step 36, sheath 16 is initially air dried for 10 minutes in a ventilated oven at about 250° F. Again the axis of the thermocouple is maintained in a vertical postion. During drying, liquid gold ink accumulates at the tip of sheath 16. Any excessive accumulation of liquid gold ink at the tip is removed in a conventional manner, such as by "blotting" with absorbent material. Typically, excessive gold ink must be removed from the tip of sheath 16 several times during drying. While blotting, particular care must be taken to avoid contact with any of the other surfaces of sheath 16, i.e. with the cylindrical portion of sheath 16. Vapors emitted from sheath 16 during this step are flammable and should not be inhaled.

To complete curing, sheath 16 is placed in an oven having an air temperature of 1150° F.±25° F. for approximately 3 minutes. As before, sheath 16 is maintained with the axis A—A in a vertical position. Adequate ventilation in the oven is necessary to disperse vapors emitted from coating 20 during curing. If the vapors are not adequately removed, coating 20 will have a dark colored surface after curing rather than a bright, shiny surface. Sheath 16 is then carefully inspected and cleaned with alcohol.

The above-mentioned steps of dipping sheath 16 into gold ink, air drying the resulting gold coating 20 and then curing gold coating 20 can be repeated to provide additional gold coatings. Each dipping of sheath 16 into "HANOVIA LIQUID GOLD INK NO. 7621" leaves a gold coating $4 \times 10^{-6}$ to $5 \times 10^{-6}$ inches thick. Preferably, a total of two such coatings is provided.

For most thermocouple applications sheath 16 is placed in direct contact with the surface of the material whose temperature is to be measured. For a thermocouple constructed for such an application, it is necessary to remove the gold coating covering a portion of the hemispheric end of sheath 16. This is accomplished by conventional abrasion techniques such as by abrading with 600 grit polishing paper or crocus cloth. Since, in use, sheath 16 may be positioned at angle other than perpendicular to a material surface, at least ¼ of the surface area of the hemispherical end of sheath 16 is preferably removed. However, any portion of gold coating 20 deposited in depressions and crevices of sheath 16 need not be removed. After this abrasion step, the tip of sheath 16 is cleaned with alcohol.

For applications using a contact thermocouple where it is desirable that the gold finish directly contact the metal surface to be monitored, none of gold coating 20 need be removed.

In summary, the invention provides a method for applying a gold coating to a thermocouple sheath such that the thermocouple sheath is more reflective than a sheath coated by the conventional prior art method and such that the thermocouple sheath can withstand extended use within an environment having a temperature of 1000° F. or more.

Although the invention has been described with respect to exemplary embodiments thereof, it will be understood by those skilled in the art that variations and modifications can be effected in these exemplary embodiments without departing from the scope and spirit of the invention.

I claim:

1. A method for coating a metal surface with gold, said method comprising the steps of: i) electropolishing said surface to remove an outer layer of said surface, ii) oxidizing said surface by placing said surface in an air environment at a temperature of at least 1000° F., iii) dipping said surface into liquid gold ink to thereby provide a gold coating on said surface, and iv) curing said gold coating by placing said surface in an oven environment at a temperature of at least 1000° F.

2. The method of claim 1, wherein said electropolishing step i) comprise placing said surface in an electrolyte bath consisting of a mixture of two parts by volume of phosphoric acid $H_3PO_4$ (85.2%) and one part by volume of sulfuric acid $H_2SO_4$ (95-98%) maintained at a temperature of between 68° F. and 72° F., and placing a stainless steel electrode having a surface area of about 20 square inches in said electrolyte bath, said electrode being connected to a cathode of a 12 volt DC battery charger rated at 20 amps while said surface is connected to a anode of said 12 volt battery charger.

3. The method of claim 2, wherein said surface is placed in said electrolyte bath for 15 to 30 seconds.

4. The method of claim 1, wherein said electropolishing step proceeds until said outer layer is removed to a depth of 0.0005 to 0.001 inches.

5. The method of claim 1, wherein said oxidizing step comprises placing said surface in an air furnace at 1125° F. to 1175° F. for 1 to 2 minutes.

6. The method of claim 1, wherein said oxidizing step proceeds until said surface acquires a thin, tightly adherent straw-colored film.

7. The method of claim 1, wherein said oxidizing step further includes a step of cooling said surface to below 100° F.

8. The method of claim 1, wherein said dipping step produces said gold coating with a depth of $4 \times 10^{-6}$ to $5 \times 10^{-6}$ inches.

9. The method of claim 1, wherein said curing step comprises placing said surface in said oven environment at a temperature between 1125° F. and 1175° F. for approximately 3 minutes.

10. The method of claim 1, wherein said curing step further includes an initial drying step comprising placing said surface in a ventilated oven at 250° F. for 10 minutes.

11. The method of claim 1 wherein said surface is the surface of a thermocouple sheath having a tip and wherein said method further includes a final step of removing any of said gold coating covering said tip.

* * * * *